United States Patent
Coolbaugh et al.

(10) Patent No.: US 7,060,612 B2
(45) Date of Patent: *Jun. 13, 2006

(54) METHOD OF ADJUSTING RESISTORS POST SILICIDE PROCESS

(75) Inventors: Douglas D. Coolbaugh, Essex Junction, VT (US); Heidi L. Greer, Essex Junction, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/711,130

(22) Filed: Aug. 26, 2004

(65) Prior Publication Data

US 2006/0046418 A1    Mar. 2, 2006

(51) Int. Cl.
*H01L 21/44* (2006.01)
(52) U.S. Cl. .............. 438/664; 438/663; 438/660; 438/659
(58) Field of Classification Search .............. None
See application file for complete search history.

(56) References Cited

U.S. PATENT DOCUMENTS

| | | | |
|---|---|---|---|
| 3,902,926 A | 9/1975 | Perloff et al. | |
| 4,411,708 A | 10/1983 | Winhan | |
| 5,047,827 A | 9/1991 | Clark, Jr. et al. | |
| 5,187,559 A | 2/1993 | Isobe et al. | |
| 5,656,524 A * | 8/1997 | Eklund et al. | 438/238 |
| 5,935,642 A | 8/1999 | Suga | |
| 6,027,965 A | 2/2000 | Stucchi et al. | |
| 6,191,018 B1 * | 2/2001 | Yue et al. | 438/592 |
| 6,369,428 B1 | 4/2002 | Lin et al. | |
| 6,562,704 B1 | 5/2003 | Yoshihisa | |
| 2005/0070102 A1 * | 3/2005 | Coolbaugh et al. | 438/689 |

* cited by examiner

*Primary Examiner*—Dung A. Le
(74) *Attorney, Agent, or Firm*—Scully, Scott, Murphy & Presser, P.C.; William D. Sabo

(57) ABSTRACT

A method of fabricating a resistor in which the resistance value of the resistor is measured and adjusted after silicidation is provided. The method of the present invention begins with first providing at least one resistor, e.g., polysilicon, having a resistance value on a surface of a semiconductor substrate. The at least one resistor has been subjected to a silicidation process. Next, the resistance value of the at least one resistor is measured to determine the actual resistance of the resistor after silicidation. After the measuring step, the resistance of the resistor is adjusted to achieve a desired resistance value. The adjusting may include a post silicidation rapid thermal anneal and/or a post silicidation ion implantation and a low temperature rapid thermal anneal step.

20 Claims, 3 Drawing Sheets

METHOD OF ADJUSTING RESISTORS POST SILICIDE PROCESS

RELATED APPLICATIONS

This application is related to co-pending and co-assigned U.S. application Ser. No. 10/605,439, filed Sep. 30, 2003, entitled "PRECISION POLYSILICON RESISTOR PROCESS". The entire content of the aforementioned U.S. application is incorporated herein by reference.

FIELD OF THE INVENTION

The present invention relates to semiconducting integrated circuits (ICs), and more particularly to a method of fabricating a resistor on a semiconductor substrate, wherein the resistance value of the resistor is adjusted after performing a silicide process.

BACKGROUND OF THE INVENTION

Polycrystalline silicon resistors, also called polysilicon or polySi resistors, have been used in the electronic circuit industry for many years. Depending upon their doping and doping levels, p+, n+, p− and n− polysilicon resistors can be fabricated. P+ polysilicon resistors are extremely advantageous for use in analog circuit designs due to their desirable figures of merits. Typically, p+ polysilicon resistors are used in analog and mixed signal circuit designs because they can provide precise matching of subsequent resistors, a low temperature coefficient of resistance, a low voltage coefficient of resistance, and a low parasitic capacitance.

Although polysilicon resistors are widely used in analog circuit designs, such resistors generally have high sheet resistance tolerances ranging from 15–20%. This means the sheet resistance changes by +/−15 to 20%. In current analog and mixed signal applications, and in order to meet stringent circuit performance requirements, circuit designers are demanding lower tolerances in polysilicon resistors.

In the current state of the art, polysilicon resistors are fabricated by ion implanting dopants into a polysilicon layer during the source/drain (S/D) implant step and/or emitter implant step. The implanted dopants in the various regions are then activated utilizing a rapid thermal anneal process. Next, a dielectric layer such as a nitride is applied to the body of the polysilicon resistor so as to protect the body of the polysilicon resistor from being silicided in a subsequent silicidation step. The ends of the polysilicon resistors are then typically exposed and silicided by employing a conventional silicidation process that includes depositing a metal atop the exposed polysilicon end portions and annealing. A single or two-step anneal process may be used in forming the silicide depending on the type of metal that is deposited. The two-step anneal typically includes a silicidation formation anneal and a silicidation transformation anneal. During the annealing step, the resistance of the polySi resistor typically changes such that the resistance value no longer meets a predetermined and required resistance value.

In view of the above drawbacks with the prior art process of fabricating Si-containing resistors, e.g., polysilicon or polySiGe, particularly the difficulties in controlling the resistance of resistors, there is a need for developing a new and improved method in which resistors, including polySi or polySiGe resistors, can be fabricated and then adjusted post silicidation.

SUMMARY OF THE INVENTION

The present invention provides a method of fabricating a resistor whose resistance is adjusted after silicidation, which does not adversely affect the process time. Moreover, the method of the present invention can be used to increase the resistance of a prefabricated and silicided resistor to a desired specification or decrease the resistance of a prefabricated and silicided resistor to a desired specification, without affecting the other semiconductor devices (i.e., field effect transistors (FETs), bipolar and/or other passive elements).

In broad terms, the method of the present invention, which forms a Si-containing resistor on a semiconductor substrate whose resistance value meets a predetermined specification, includes the steps of:

providing at least one resistor having a resistance value on a surface of a semiconductor substrate, said at least one resistor having been subjected to a silicidation process;

measuring the resistance of the at least one resistor to determine actual resistance of the resistor after silicidation; and adjusting the resistance of the resistor to achieve a desired resistance value.

In one embodiment, the adjusting step may include the use of a rapid thermal anneal at a specific temperature and time which deactivates dopants within a doped Si-containing layer of the resistor.

In another embodiment of the present invention, the adjusting step may include the use of ion implantation and a low temperature (less than about 800° C.) rapid thermal anneal.

In a yet further embodiment of the present invention, the measuring and adjusting steps are repeated at least once.

In an even further embodiment, both adjusting steps are employed.

The present invention, which provides a process for fabricating Si-containing resistors that are measured and adjusted post silicidation, will now be described in greater detail by referring to FIGS. 1A–1D that accompany the present application. In the accompanying drawings, like and/or corresponding elements are referred to by like reference numerals.

It is noted that the drawings of the present invention show a fragment of a semiconductor wafer or chip in which only one resistor device region is shown. Although the drawings show the presence of only a single resistor device region, the present process can be used in forming a plurality of resistors across different resistor device regions on the surface of a single semiconductor chip or wafer. Additionally, the process of the present invention can be integrated with any conventional CMOS, bipolar, or BiCMOS (bipolar and CMOS) processing scheme. Thus, other device regions including bipolar transistors and/or FETs can be formed to the periphery of the resistor device region shown in the drawings of the present application.

The following description provides details on one possible method that can be used in forming a resistor device. Specifically, the following description details the processing steps that are used in fabricating a precision polySi or polySiGe resistor device such as described in the U.S. application mentioned in the Related Applications Section of the present application. Although this methodology is described in detail, the present invention also contemplates other methods, such as, for example, the method described in the Background Section of the present application, that can be used in forming a polySi or polySiGe resistor on a semiconductor substrate. The other methods are conventional and are known to those skilled in the art of semiconductor device manufacturing. Hence, the present invention is not limited to the specific processing steps described below in fabricating a polySi or polySiGe resistor on a substrate. Any processing scheme can be used and is contemplated herein.

Figure 1A:
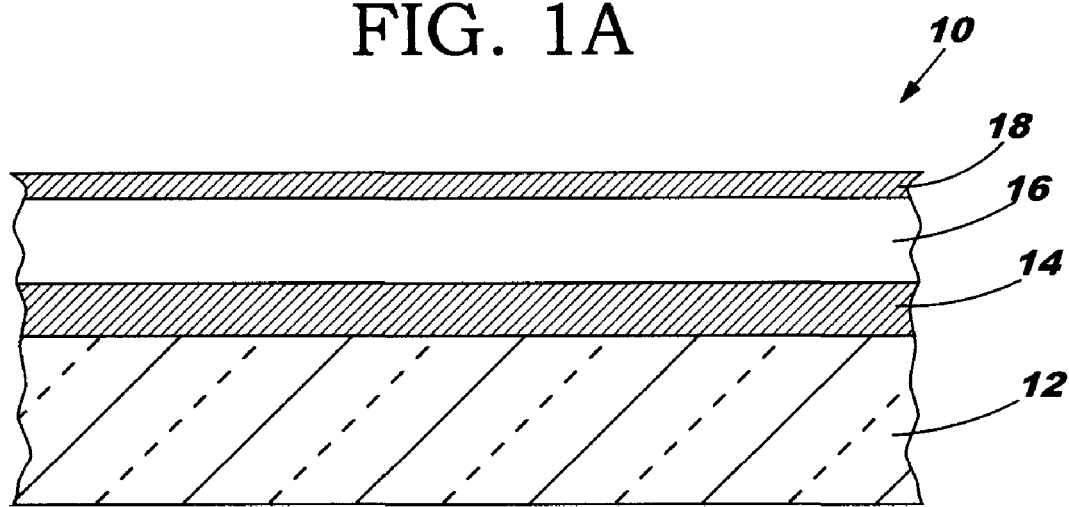
FIGS. 1A–1D are pictorial representations (through cross sectional views) illustrating the basic processing steps that are employed in the present invention for fabricating a resistor.

Reference is first made to the initial structure 10 (i.e., a partial resistor) shown in FIG. 1A. The initial structure 10 includes semiconductor substrate 12, optional first dielectric layer 14 located on the semiconductor substrate 12, a polySi or polySiGe (hereinafter Si-containing) layer 16 located on either the optional first dielectric layer 14 or the semiconductor substrate 12, and second dielectric layer 18 located on the Si-containing layer 16.

The semiconductor substrate 12 of the initial structure 10 shown in FIG. 1A comprises any semiconductor material including, but not limited to: Si, Ge, SiGe, SiC, SiGeC, Ga, GaAs, InAs, InP, silicon-on-insulators, SiGe-on-insulators and all other III/V compound semiconductors. Of these semiconducting materials, it is highly preferred that semiconductor substrate 12 be composed of a Si-containing semiconductor.

The semiconductor substrate 12 may be doped, undoped or contain doped and undoped regions therein. The semiconductor substrate 12 may contain active device regions and/or device isolation regions embedded in the surface thereof. For clarity, such regions are not shown in FIG. 1A, but nevertheless the same could be present in the semiconductor substrate 12. For example, the Si-containing layer 16 can be formed directly atop an isolation region such as a trench isolation region or field oxide region that is present in or on the substrate 12. In such an embodiment, the optional first dielectric layer 14 is not typically formed on the isolation region.

When present, the optional first dielectric layer 14 is composed of any material that is capable of serving as an insulator between semiconductor substrate 12 and doped resistor region 16a to be subsequently formed. The present invention thus contemplates the use of inorganic as well as organic dielectric materials as the optional first dielectric layer 14. Suitable dielectric materials for use as the optional first dielectric layer 14 include, but are not limited to: $SiO_2$, $Si_3N_4$, perovskite-type oxides such as barium strontium titanate, diamond, diamond-like carbon, polyimides, silicon-containing polymers and other like dielectric materials. Of the dielectric materials mentioned above, it is highly preferred that the optional first dielectric layer 14 be composed of $SiO_2$ or $Si_3N_4$.

Optional first dielectric layer 14 is formed on the surface of the semiconductor substrate 12 by either growing the dielectric layer using a thermal growing process or by depositing the dielectric layer using a deposition technique such as, for example, chemical vapor deposition (CVD), plasma-assisted chemical vapor deposition, spin-on coating, dip coating and other deposition processes known to those skilled in the art. While not critical to the present invention, the final thickness of the optional first dielectric layer 14 is from about 100 to about 3000 Å. If needed, the structure containing the semiconductor substrate 12 and the optional first dielectric layer 14 can be planarized using a planarization technique known to those skilled in the art such as, for example, chemical-mechanical polishing (CMP) or grinding.

Next, the Si-containing layer 16 is formed on the surface of the optional first dielectric layer 14 or the semiconductor substrate 12 (when the optional first dielectric layer 14 is not present) using a deposition technique known to those skilled in the art. For example, chemical vapor deposition, plasma-assisted chemical vapor deposition or sputtering may be used to form the Si-containing layer 16. Alternatively, the Si-containing layer 16 can be formed by an epitaxy growth process. As indicated above, the term "Si-containing layer" refers to either polySi or polySiGe. The Si-containing layer 16 formed outside the resistor device region shown in the drawings of the present invention can be used in forming the emitter or base of a bipolar transistor, and/or a gate conductor of a CMOS device. In one embodiment of the present invention, it is preferred that the Si-containing layer 16 is comprised of polySi.

A highly preferred means for depositing the Si-containing layer 16 is by the pyrolysis of a silane with, or without, a germanium source, at low temperatures such as between 500° to 750° C. The thickness of the Si-containing layer 16, which is also not critical to the present invention, is typically from about 500 to about 3000 Å.

A second dielectric 18, which is comprised of an inorganic dielectric such as an oxide, nitride, oxynitride or any combination thereof, is then formed atop the Si-containing layer 16. The second dielectric layer 18 is preferably an oxide such as $SiO_2$. The second dielectric layer 18 is formed utilizing one of the techniques mentioned above in forming the optional first dielectric layer 14. In some embodiments of the present invention, second dielectric layer 18 is omitted.

In one embodiment, the resistor device region can be protected at this point of the present invention and the other devices such as FETs and bipolar devices can now be fabricated. Following the fabrication of the other devices, the protective material covering the resistor device region is typically removed.

For example, a protective dielectric layer (not shown) is formed across the entire structure including the exposed second dielectric layer 18 in the resistor device region. The protective dielectric layer is comprised of an inorganic dielectric that differs from the second dielectric layer 18. In particular, the protective dielectric layer may be comprised of an oxide, nitride, oxynitride or any combination thereof. The protective dielectric layer is preferably a nitride such as SiN. The protective dielectric layer is formed utilizing one of the techniques mentioned above in forming the optional first dielectric layer 14. The thickness of protective dielectric may vary, but typically the protective dielectric layer has a thickness from about 10 to about 1000 Å.

In some embodiments of the present invention, the above protection scheme is not employed and the resistor device region is fabricated together with the other device regions.

Figure 1B:
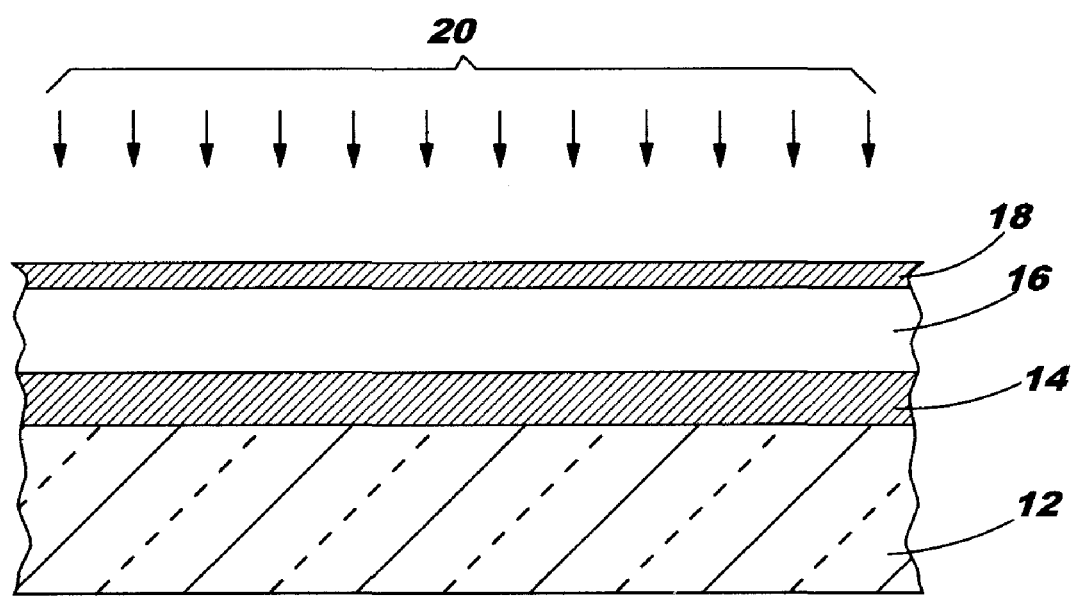

Dopant ions 20 are then implanted into the Si-containing layer 16 of each resistor device region through at least the second dielectric layer 18 as shown in FIG. 1B. In some embodiments of the present invention in which the second dielectric layer 18 is not present, dopant ions 20 are implanted directly into the Si-containing layer 16. The dopant ions 20 are implanted to provide a dopant concentration from about $1 \times 10^{14}$ to about $1 \times 10^{21}$ atoms/cm$^3$ within the Si-containing layer 16 in each resistor device region. The particular doping concentration can be selected to provide a predetermined and desired resistance value to the Si-containing layer 16.

Any conventional n- or p-type dopant ion may be used at this point of the present invention. Thus, the present invention is capable of forming p−, p+, n−, n+ resistors. Preferably, p+ resistors, particularly polySi, are formed in the present invention. After doping of the Si-containing layer 16 within each resistor device region, the structure is typically annealed at temperatures which are sufficient to activate the dopants implanted into the Si-containing layer 16 forming doped and activated Si-containing layer 16a (see, the structure shown in FIG. 1C). In some embodiments of the present invention, the activation of the dopants within the doped Si-containing layer 16 can be delayed and performed during another subsequent thermal event. For example, the activation of dopants within the Si-containing layer 16 may be carried out during the silicidation anneal.

If a separate anneal is used to activate the dopants within the Si-containing layer 16, the anneal is typically carried out at this point of the present invention using a furnace anneal or a rapid thermal anneal (RTA). Typically, this annealing step is carried out in an inert gas atmosphere, e.g., He, Ar, Ne and/or N$_2$, which may be mixed with less than about 10% oxygen. It is also possible to use an oxidizing ambient in place of an inert gas atmosphere during the annealing of the resistor.

The exact temperatures and times of annealing vary depending on the annealing technique used as well as the type of dopant found in layer 16. For example, when a furnace anneal is employed and boron is used as the dopant species, annealing is carried out at a temperature of about 900° C. for a time period of about 20 minutes. For the same dopant species, RTA is carried out at about 950° C. for about 7 seconds. On the other hand, when As is the dopant species, the furnace anneal is carried out at about 750° C. for about 20 minutes. Reduced annealing times can be employed when RTA is used in activating As.

Figure 1C:
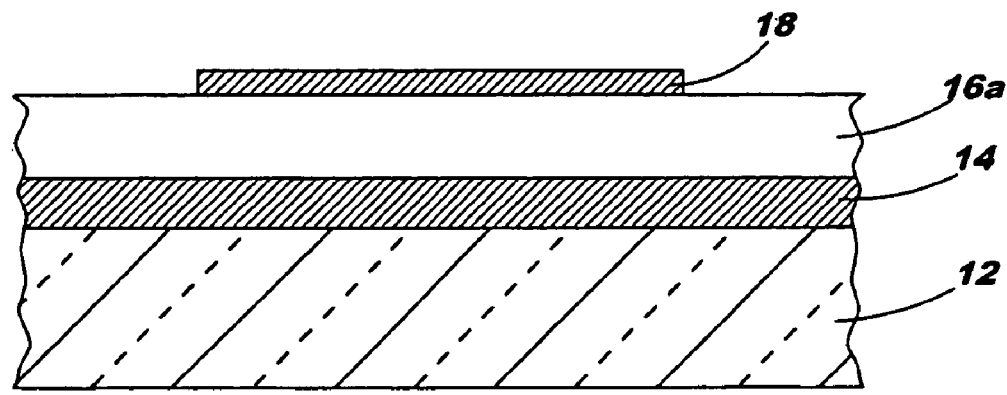

In some embodiments of the present invention, the second dielectric layer 18 is then patterned by lithography and etched to expose end surface regions of the doped Si-containing layer 16a, See FIG. 1C. A conductive metal that is capable of being converting into a silicide by reacting with the underlying and contacting doped Si-containing layer 16a is then formed on each exposed end surface region. Examples of conductive metals that can be employed in the present invention include, but are not limited to: Ni, Ti, W, Co, and other like metals, including alloys thereof. Highly preferred metals include Ti and Co. The thickness of the conductive metal formed at this point of the present invention may vary. A typical thickness range for the conductive metal is from about 100 to about 500 Å.

The conductive metals can be formed utilizing any deposition process known to those skilled in the art. Illustrative examples of suitable deposition processes that can be used in forming the conductive metal include, but are not limited to: sputtering, atomic layer deposition, evaporation, chemical vapor deposition, chemical solution deposition and other like deposition processes.

After conductive metal deposition, the structure is subjected to a silicidation anneal, which may include a one or two-step anneal. The silicidation annealing conditions may vary depending on the conductive metal that was previously deposited. Such annealing conditions are well known to those skilled in the art. It is noted that if not previously done, the silicidation anneal may also be used to activate the dopants within the doped Si-containing layer 16a.

The silicide anneals are self-aligned processes that are carried out in a gas atmosphere, e.g., He, Ar, Ne, N$_2$ and/or forming gas. The silicide annealing steps may use different atmospheres or the annealing steps may be carried out in the same atmosphere. For example, He may be used in both annealing steps, or He can be used in the first annealing step and a forming gas may be used in the second annealing step.

The one step anneal is performed at a temperature from about 300° to about 800° C. More preferably, the one step anneal is performed at a temperature from about 500° to about 700° C. The one step anneal is typically employed when Ni is used as the conductive metal. An etching step may follow the one step silicide anneal to remove any unreacted metal from the structure.

The two-step annealing process includes a first annealing step and a second annealing step. An etching step is typically performed between the two anneals to remove any unreacted metal. Typically, the first annealing step, which forms a high resistance silicide phase material, is performed at a temperature from about 400° to about 600° C. using a continuous heating regime or various ramp and soak heating cycles. More preferably, the first annealing step is performed at a temperature from about 450° to about 550° C. The second annealing step is performed at a temperature from about 600° C. to about 900° C. using a continuous heating regime or various ramp and soak heating cycles. More preferably, the second annealing step is performed at a temperature from about 700° C. to about 800° C. for cobalt conversion to a final low resistivity CoSi$_2$ phase. The second anneal converts the high resistance silicide into a silicide phase of lower resistance and these temperatures are well known by those skilled in the art for various conductive metals.

Figure 1D:
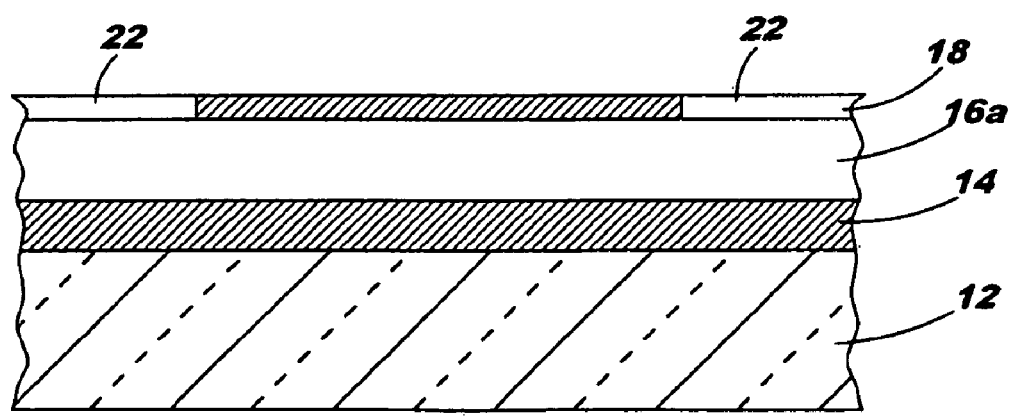

The resultant structure after the silicide anneals have been performed is shown, for example, in FIG. 1D. Reference numeral 22 denotes the silicide contact regions formed utilizing the above steps. The resistor includes layers 18, 16a, and 12.

It is again noted that the process steps described above in connection with FIGS. 1A–1D illustrate one possible method of forming a resistor on a surface of a semiconductor substrate. Although this method is described in detail herein, the present invention also contemplates other techniques that can be used in forming a resistor having adjacent silicide regions. Hence, the present invention is not limited to the process flow described above. Instead, that process flow represents a preferred embodiment of the present invention.

At this point of the present invention, the resistance value of the resistor including doped Si-containing layer 16a is measured to determine the resistance post silicidation. If the resistance value post silicidation is higher or lower than a set specification level, the resistance of the resistor can be adjusted at this point of the present invention. If the resistance of the resistor is within a set specification level, no adjustment is needed and the device can be completed. Depending on the device being manufactured, it is possible to complete formation of the bipolar transistors and/or CMOS devices after silicide formation using well-known FEOL (front-end-of-the-line) processing. Additionally, a conventional BEOL (back-end-of-the-line) process may be employed at this point of the present invention to connect the silicide contact regions 66 of the resistor to an external wire.

The measuring of the resistance value of the resistor post silicidation can be achieved by using any conventional technique known to those skilled in the art. For example, a four point probe measurement can be used to measure the resistance of the resistor post silicidation.

If adjusting is required, the following two embodiments can be used to adjust the resistance of the resistor post silicidation to the desired and set specification level. In one embodiment, the adjustment of the resistance of the resistor post silicidation can be performed by employing a post silicidation rapid thermal anneal step at a specific temperature and time which is sufficient to deactivate dopants (hence increase resistance) of the resistor. The post silicidation rapid thermal anneal step is performed as a separate step or it can be performed during a later thermal step such as, for example, during annealing of the contact studs.

The post silicidation rapid thermal anneal step is typically performed at a temperature from about 500° to about 800° C. for a time period from about 1 to about 120 seconds. More typically, the post silicidation rapid thermal anneal step is performed at a temperature from about 650° to about 750° C. for a time period from about 30 to about 60 seconds. The above conditions are typical conditions; thus, the present invention is not limited to the above-mentioned ranges. Instead, the post silicidation rapid thermal anneal step is performed using any conditions which is capable of deactivating dopants within the resistor, e.g., doped Si-containing layer 16a and does not significantly shift the other devices on the substrate/wafer. The post silicidation rapid thermal anneal step is performed in an inert gas ambient such as, for example, He, Ar, Ne, $N_2$ and mixtures thereof. A forming gas ambient is also contemplated herein.

In the second embodiment, a post silicidation ion implantation and low temperature rapid thermal anneal is used. This step of the present invention includes first implanting ions such as, for example, B, In, P, As or Sb (preferably B or As) into the resistor. The implant step is performed using conditions such that the peak ion concentration is located within the doped Si-containing layer 16a, of the resistor. This step of the present invention increases the resistance of the resistor through counter-doping or reorganization of dopants. This step of the present invention can also decrease the resistance by increasing the dopant concentration of the resistor.

The concentration of dopants implanted during this step of the present may vary depending on the type of dopant species employed. Typically, however, the ions implanted at this point of the present invention have a concentration from about 1E14 to about 1E16 atoms/cm$^2$. The energy of this post silicidation implant may also vary depending on the type of species being implanted and the films that one must implant through to reach the doped Si-containing layer. A typical energy range that is employed in the present invention is from about 5 to about 50 keV.

The low temperature rapid thermal anneal step is typically performed at a temperature of about 800° C. or below for a time period from about 1 to about 120 seconds. More typically, the low temperature rapid thermal anneal step is performed at a temperature from about 600° to about 750° C. for a time period from about 30 to about 60 seconds. The above conditions are typical conditions; thus, the present invention is not limited to the above-mentioned ranges. The annealing is performed using an inert or forming gas ambient as described in the above embodiment. This step of the present invention decreases the resistance of the resistor by introducing activated dopants into the resistor.

It is noted that the present invention also contemplates an embodiment in which both the first and second adjusting processes mentioned above are employed.

The above adjusting steps are capable of centering the resistance of a resistor to a desired value that meets a given specification. The inventive adjusting steps have shown the ability to adjust (increase and/or decrease) the resistance of a resistor by +30% to −30%. Moreover, the method of the present invention is very stable and repeatable.

Figure 2:
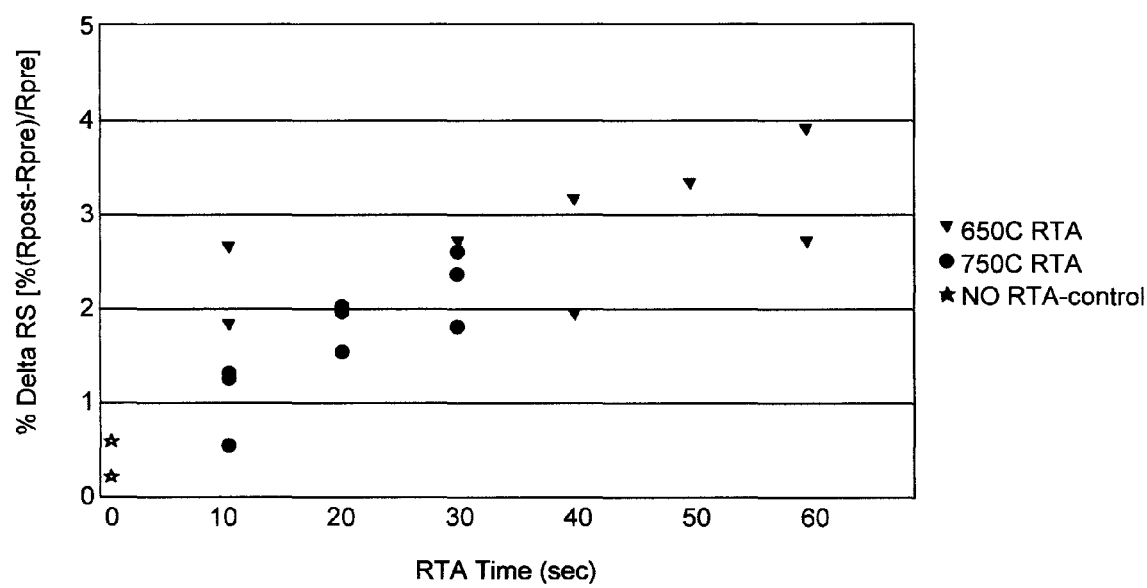
FIG. 2 is a graph showing the % shift of p+ polysilicon resistance Rs vs. rework rapid thermal anneal RTA time for various RTA temperatures after suicide processing.

FIG. 2 shows the percent shift of resistance for a p+ polysilicon resistor for various RTA times with anneal temperatures set at 650° C. and 750° C. The graph illustrates the time dependence of the post silicidation rapid thermal anneal step on the deactivation of the dopants in a p+ polysilicon resistor. The post silicidation RTA rework process would typically be implemented when a resistor is shown to be below the resistor lower specification limit by, but not limited to, 5%. The deactivation from this post silicidation RTA is time dependent and one could implement any predetermined temperature and any required time necessary to increase the resistance to a required value. This deactivation of dopants (i.e., increased resistance) is limited by the effect of the anneal process on any other devices, active or passive on the shared substrate (i.e., FETs, NPNs, resistors, diodes, or capacitors).

Figure 3:
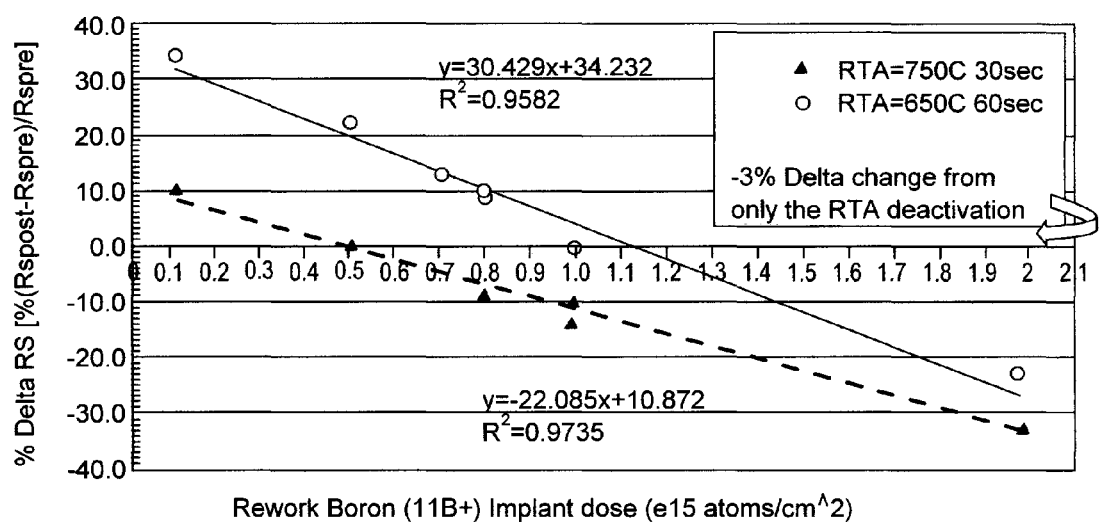
FIG. 3 is a graph showing the % delta p+ polysilicon resistance Rs vs. rework implant does for 750° C., 30 seconds and 650° C., 60 seconds rework RTA.

FIG. 3 shows the percent shift of resistance for a p+ polysilicon resistor after an additional boron ion implant and rapid thermal anneal is performed. The graph shows wafer data from samples with ion implant doses ranging from 1e14 to 2e15 atoms/cm$^2$ and RTA processing at 750° C. and 650° C. One can see that the lower ion implant doses actually increase the sheet resistance and the higher doses tend to decrease the sheet resistance of the p+ polysilicon resistor. The data obtained from the lower doses (i.e., <5e14 for 750° C. and <1e15 for 650° C. RTA process) is somewhat counterintuitive since one would expect the addition of p-type dopants into a p+ polysilicon resistor to increase the net dopant concentration and thus reduce the resistance. Note that it is also observed that for the 650° C. RTA the ion implant dose that is necessary to decrease the resistance is larger than implant dose necessary for the 750° C. RTA. The resistance starts to decrease at doses greater than 5e14 and 1e15 for the 750° C. and 650° C. RTA, respectfully.

One theory for the increasing resistance at the lower doses is the redistribution of the previously active dopants to inactive states. This is explained by displacement of substitutional boron atoms to either interstitial or grain boundary sites within the polysilicon, rendering them electrically inactive thus increasing resistance. During the ion implant there is damage to the Si-lattice resulting in the formation of vacancies and interstitials. At lower ion implant doses, these vacancies are either left empty or filled with interstitial silicon atoms. Thus, the resistance increases in the polysilicon resistor.

At higher ion implant doses the probability that the vacancies are filled with boron versus silicon atoms is higher do to the increased concentration of interstitial boron present. Thus, the resistance decreases in the polysilicon resistor.

The differences observed between the two different anneals is similarly explained. Lower anneal temperatures will not heal the damage caused by the implant as much as higher temperature anneals and, in addition, are less likely to move boron at interstitials or grain boundaries sites to the vacancies created by the implant. Thus, the concentration of vacancies and interstitials is greater therefore requiring higher ion implant doses in order to fill all of the vacancies created by the implant. Once this critical implant dose is reached any additional dopants from higher implant doses would be able to contribute to the active dopant concentration and reduce the resistance of the resistor.

Note that one could also implement well known counter-doping methods in order to increase the resistance of a resistor. For example and for a p-type resistor, one could implant n-type dopants and likewise for a n-type resistor one could implant p-type dopants in order to increase the resistance of a resistor post silicidation.

In addition to the processing described above, one may also implement all embodiments describe above prior to the silicidation process. This enables a larger temperature range because the rework anneal implemented post silicidation would be limited by a technologies silicidation process. One would not want to implement any temperature higher than the silicide process temperature if the rework was to be implemented post silicidation, but if it were implemented prior to the silicide process one could use temperatures up to at least 1000° C., limited only by thermal budget requirements of devices in a technology. This embodiment would consist of similar techniques, but prior to the silicidation process, one would implement a 4 point probe measurement on a resistor's doped Si-containing layer. If the sheet resistance value is higher or lower than a set of specification level, the sheet resistance of the resistor can be adjusted by implementing similar techniques described in the earlier embodiments. If one were to implement the ion implantation technique, one could choose to use the standard silicidation thermal cycle to activate the additional dopants added by the rework process or add a low temperature rapid thermal anneal prior to the silicidation process.

While the present invention has been described and shown with respect to preferred embodiments thereof, it will be understood by those skilled in the art that the foregoing and other changes in forms and details may be made without departing from the spirit and scope of the present application. It is therefore intended that the present application not be limited to the exact forms described and illustrated, but fall within the scope of the appended claims.

What is claimed is:

1. A method of fabricating a resistor on a semiconductor substrate comprising the steps of:
   providing at least one resistor having a resistance value on a surface of a semiconductor substrate, said at least one resistor having been subjected to a silicidation process;
   measuring the resistance of the at least one resistor to determine actual resistance of the resistor after silicidation; and
   adjusting the resistance of the resistor to achieve a desired resistance value.

2. The method of claim 1 wherein said measuring is performed by a four point probe measurement.

3. The method of claim 1 wherein said adjusting comprising a rapid thermal anneal step.

4. The method of claim 3 wherein said rapid thermal anneal step is performed at a temperature from about 500° to about 800° C. for a time period from about 1 to about 120 seconds.

5. The method of claim 4 wherein said rapid thermal anneal step is performed at a temperature from about 650° to about 750° C. for a time period from about 30 to about 60 seconds.

6. The method of claim 3 wherein said rapid thermal anneal is performed in an inert or forming gas ambient.

7. The method of claim 1 wherein said adjusting comprises ion implantation and a low temperature rapid thermal anneal step.

8. The method of claim 7 wherein said ion implantation comprises implanting at least one ion of boron (B), indium (In), phosphorus (P), arsenic (As) or antimony (Sb).

9. The method of claim 8 wherein said at least one ion comprises B or As.

10. The method of claim 7 wherein said low temperature rapid thermal annealing step is performed at a temperature of about 800° C. or less for a time period from about 1 to about 120 seconds.

11. The method of claim 7 wherein said low temperature rapid thermal annealing step is performed at a temperature from about 600° to about 750° C. for a time period from about 30 to about 60 seconds.

12. The method of claim 7 wherein said low temperature rapid thermal anneal step is performed in an inert or forming gas ambient.

13. The method of claim 1 wherein said adjusting comprises a combination of a rapid thermal anneal step and a step including ion implantation and a low temperature rapid thermal anneal.

14. The method of claim 1 wherein said resistor includes a doped Si-containing layer.

15. The method of claim 14 wherein said doped Si-containing layer comprises polysilicon or polySiGe.

16. The method of claim 1 further comprising repeating said steps of measuring and adjusting at least once.

17. The method of claim 1 wherein said silicidation process comprises at least a one step anneal.

18. The method of claim 17 further comprising etching and a second annealing step.

19. A method of fabricating a resistor on a semiconductor substrate comprising the steps of:
   providing at least one polySi resistor having a resistance value on a surface of a semiconductor substrate, said at least one polySi resistor having been subjected to a silicidation process;
   measuring the resistance of the at least one polySi resistor to determine actual resistance of the resistor after silicidation; and
   adjusting the resistance of the resistor to achieve a desired resistance value, said adjusting comprises a rapid thermal anneal step or ion implantation and a low temperature rapid thermal anneal step.

20. The method of claim 19 wherein said measuring and said adjusting steps are repeated at least once.

* * * * *